(12) United States Patent
Zhu et al.

(10) Patent No.: US 10,778,173 B2
(45) Date of Patent: Sep. 15, 2020

(54) AUDIO DISTORTION COMPENSATION

(71) Applicant: Cirrus Logic International Semiconductor Ltd., Edinburgh (GB)

(72) Inventors: Hezi Zhu, Austin, TX (US); Roberto Napoli, Milan (IT); Jie Su, Austin, TX (US); Waleed Eshmawy, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/169,723

(22) Filed: Oct. 24, 2018

(65) Prior Publication Data
US 2020/0036356 A1 Jan. 30, 2020

Related U.S. Application Data

(60) Provisional application No. 62/703,238, filed on Jul. 25, 2018.

(51) Int. Cl.
*H03F 99/00* (2009.01)
*H03G 7/00* (2006.01)
*H03G 11/00* (2006.01)
*H03F 1/32* (2006.01)

(52) U.S. Cl.
CPC ............ *H03G 7/004* (2013.01); *H03F 1/3247* (2013.01); *H03G 11/008* (2013.01)

(58) Field of Classification Search
CPC ....................................................... H03F 99/00
See application file for complete search history.

(56) References Cited

U.S. PATENT DOCUMENTS

| | | | | |
|---|---|---|---|---|
| 10,149,051 B2* | 12/2018 | Thyssen | ............... | H04R 29/003 |
| 10,165,361 B2* | 12/2018 | Thyssen | ............... | G10L 21/0232 |
| 10,200,003 B1* | 2/2019 | Slotnick | ............... | H04R 3/04 |
| 10,341,768 B2* | 7/2019 | Hu | ............... | H04R 29/001 |
| 2004/0086140 A1 | 5/2004 | Fedigan et al. | | |
| 2012/0288118 A1* | 11/2012 | Gautama | ............... | H04R 3/007 |
| | | | | 381/98 |
| 2016/0373858 A1* | 12/2016 | Lawrence | ............... | H04R 3/007 |
| 2018/0160228 A1* | 6/2018 | Hu | ............... | H04R 3/007 |
| 2018/0220233 A1* | 8/2018 | Napoli | ............... | H04R 3/007 |
| 2019/0098403 A1* | 3/2019 | Osterneck | ............... | H04R 3/007 |
| 2019/0166431 A1* | 5/2019 | Hare | ............... | H04R 9/022 |

FOREIGN PATENT DOCUMENTS

EP 2797340 A2 10/2014

OTHER PUBLICATIONS

International Search Report and Written Opinion of the International Searching Authority, International Application No. PCT/GB2019/052058.

* cited by examiner

*Primary Examiner* — Olisa Anwah
(74) *Attorney, Agent, or Firm* — Jackson Walker L.L.P.

(57) ABSTRACT

A method for compensating for a change in back electric motive force in a transducer in a device, wherein the transducer is driven by an output signal output by an amplifier, and a back volume of the transducer is formed by an enclosure within the device. The method comprises: receiving an input signal; determining, based on a characteristic of the transducer that the transducer has moved from an equilibrium position within the device; and based on the determination, adjusting a gain applied to the input signal by the amplifier to generate the output signal.

27 Claims, 7 Drawing Sheets

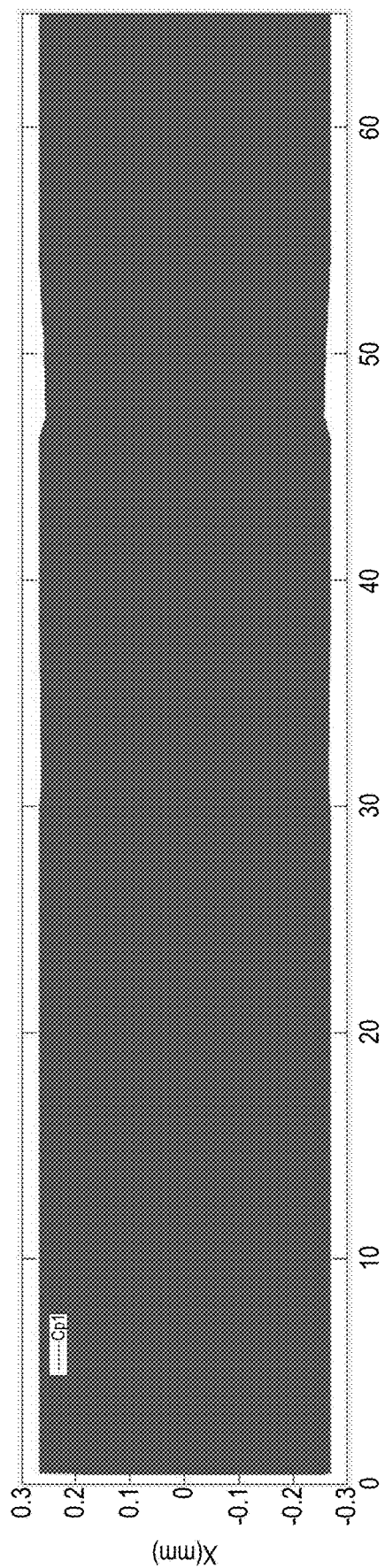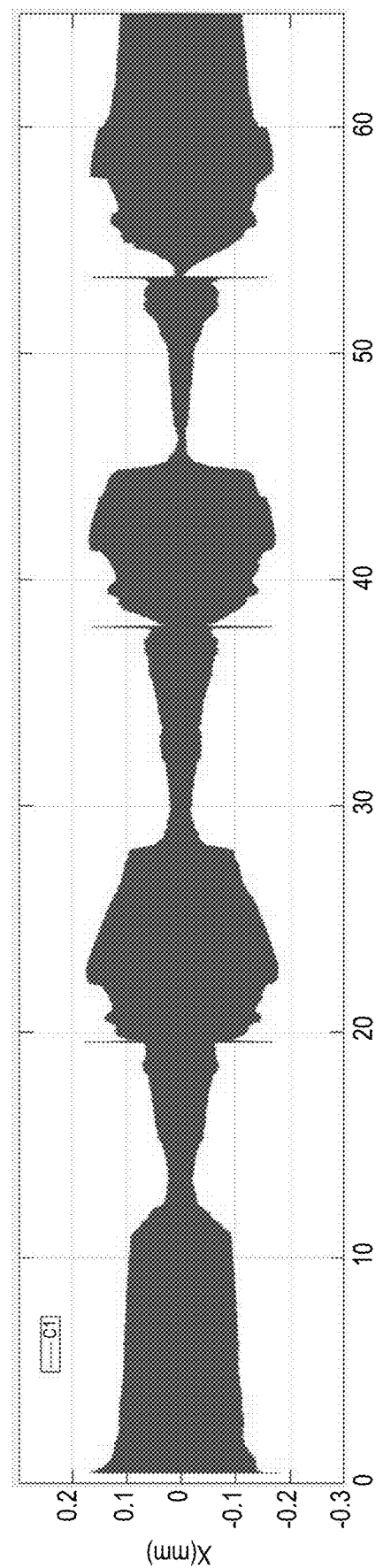
Fig. 4a
Fig. 4b

AUDIO DISTORTION COMPENSATION

TECHNICAL FIELD

Embodiments disclosed herein relate to methods and apparatus for compensating for a change in back electric motive force in a transducer in a device, wherein the transducer is driven by an output signal and a back volume of the transducer is formed by an enclosure within the device.

BACKGROUND

With the development of the mobile market, there is an increasing demand for higher audio quality. One important factor for high audio quality is volume, which is directly related to the excursion of the transducer speaker. If the speaker is moving so much that it collides with the outer enclosure of the mobile device, unpleasant or distorted audio effects might occur.

With an increase in the number of mechanical parts and semiconductor parts integrated inside a device such as a mobile device, while still maintaining a relatively smaller physical design of the whole device, it may be important for the size of the individual parts within the device to be minimized.

FIG. 1a illustrates an example of a mobile device 100 according to the prior art.

In this example the earpiece speaker 101 comprises a driver unit with no separate enclosure, and the driver unit uses the empty space inside the mobile device 100 as its back volume (i.e. rather than having a separate enclosure forming a back volume). The problem with this kind of design is without a dedicated enclosed space acting as the back volume, the air dynamics may change easily under various circumstances, and it may affect the audio performance. For example, the complexity of the physical layout inside the device, the material used for the case of the device, or the force applied from user movement, for example, tapping to send a message or squeezing to play a game, can all contribute to the audio performance by affecting the air pressure in the back volume formed by the empty space inside the device.

The loudspeaker 102, which is usually placed on the bottom of a mobile device, is generally the main speaker in the acoustic system. The loudspeaker 102 does not usually introduce the same distorted sound problem as the earpiece speaker 101 as it usually has a dedicated sealed enclosure acting as the back volume, and therefore experiences less effects from the bent force or change of the air dynamics. However, in some circumstances, the loudspeaker may also experience similar problems.

FIG. 1b illustrates the earpiece speaker 101 of the device 100 in more detail. In particular, the device 100 comprises a casing 12 and a plurality of perforations 16 (or equivalent thereof) in the casing 12, for providing fluid communication between the inside of the device 100 and a surrounding environment. The earpiece speaker assembly includes a speaker or transducer unit 21 and mounting support 22. The speaker or transducer unit 21 may be attached to the mounting support 22 with a flexible support 23. The mounting support 22 may be attachable to the casing using a mounting adhesive 24 or equivalent means of attachment (e.g. welding, glue bonding, screws, rivets, mechanical interconnections, etc.). The casing 12 defines an enclosure 18 into which the components for use in the device (e.g. electrical components, mechanical components, assemblies, integrated earpiece speaker assembly, etc.) may be placed. The integrated earpiece speaker assembly may be placed adjacent to the perforations 16 such that the speaker or transducer unit 21 separates the perforations 16 from the rest of the enclosure 18 of the device 100 (e.g. effectively forming an air-tight seal between the perforations 16 and the rest of the enclosure 18).

The integrated earpiece speaker assembly may be provided without a well-defined back volume. The back volume for the speaker or transducer unit 21 may be at least partially shared with the rest of the enclosure 18 of the device 100. Thus, the back volume for the speaker or transducer unit 21 may not be fully defined until the integrated earpiece speaker assembly is fully integrated into the final device 100 (e.g. along with all the other components that makeup the CED 10).

An example of an undesirable audio effect, is a buzzing or distorted audio that occurs when a user squeezes the device. The buzzing or distortion is due to the fact that when users apply force and bend the case of the device, air pressure inside the case changes and results in the corresponding change in the back electric motive force (EMF) on the transducer. For speakers, the back EMF is the force which opposes the change in current that induced it. This change of back-EMF results in a direct current (DC) offset of the speaker, and elevates the speaker or transducer within the device, which may lead to collisions between moving speaker membrane and the case of the device. The DC offset causes the excursion of the diaphragm of the transducer or speaker to manifest an asymmetric behaviour, for example the diaphragm moves more in one direction than in the other.

This DC offset may be recovered naturally with the auto-balance of the air dynamics, and the transducer will move back to an equilibrium position. As this natural recovery occurs, the distorted audio effect will slowly decrease until it disappears. For this reason, the worst distortion usually happens at the time of the tapping, squeezing, or releasing event. The intensity of the audio distortion is related to the audio signal being played, and the volume of the audio signal, as well as the pressure level and the rate of change of the air pressure in the back volume. As louder music is played, and as quicker and harder the pressure is applied, the more severe the audio distortion may be.

The audio distortion may be more severe in tablet devices, as tablet devices may suffer from more widely spread pressure, and the air dynamics within the device may therefore recover more slowly than in a smaller/integrated device like a mobile phone. A fast-acting algorithm to detect and cancel the undesired audio effect may therefore be required.

One reactive effect of the change in back-EMF is an increase in the speaker or transducer impedance. The impedance of the speaker or transducer reaches its peak at resonant frequency $f_0$ where the excursion reaches its peak for the same input voltage. One method for detecting a change of the back-EMF of a speaker is to track the resonant frequency $f_0$ of the speaker. However, this method is not reliable and robust enough for the distortion detection for several reasons. First, besides the change of back-EMF, many other factors may contribute to the shifting of the resonant frequency $f_0$, for example, a temperature change, and therefore the change of resonant frequency $f_0$ is not a sufficient evidence for just being caused by the change of the back-EMF. Second, the detection of the resonant frequency requires a complicated algorithm and usually does not meet the real-time requirement for detecting the change in back-EMF in time to compensation for the distortion it will cause.

At the same time, it is not practical to obtain an accurate resonant frequency $f_0$ by performing an evenly distributed frequency sweep on the embedded real-time digital signal processor (DSP) system. Instead, normally the audio input is used as the source to realize the resonant frequency tracking. In this case, if the input signal does not have energy at the resonant frequency $f_0$, e.g., if the input signal comprises a tone or signal at specific frequency range that does not cover the resonant frequency $f_0$, then the change of resonant frequency $f_0$ may not be detected.

Given the drawbacks of the method described above, the present disclosure seeks to provide a more robust and fast acting method to compensation for audio distortion related to the change of the back-EMF in a transducer.

SUMMARY

According to embodiments described herein, there is provided a method for compensating for a change in back electric motive force in a transducer in a device, wherein the transducer is driven by an output signal output by an amplifier, and a back volume of the transducer is formed by an enclosure within the device. The method comprises: receiving an input signal; determining, based on a characteristic of the transducer that the transducer has moved from an equilibrium position within the device; and based on the determination, adjusting a gain applied to the input signal by the amplifier to generate the output signal.

According to some embodiments there is provided a compensation module for compensating for a back electric motive force change in a transducer in a device, wherein the transducer is driven by an output signal output by an amplifier and a back volume of the transducer is formed by an enclosure within the device. The compensation module comprises: an input for receiving an input signal; a determination block configured to determine, based on a characteristic of the transducer, that the transducer has moved from an equilibrium position within the device; and a gain adjustment block configured to, based on the determination, adjust a gain applied to the input signal by the amplifier to generate the output signal.

BRIEF DESCRIPTION OF THE DRAWINGS

For a better understanding of the embodiments of the present disclosure, and to show how it may be put into effect, reference will now be made, by way of example only, to the accompanying drawings, in which:

FIG. 4a illustrates a graph of the first predicted value $C_{P1}$ as a function of time for an output signal $A_{OUT}$ comprising a single frequency tone;

FIG. 4b illustrates a graph of the first value $C_1$ as a function of time for an output signal $A_{OUT}$ comprising a single frequency tone;

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiment discussed below, and all such equivalents should be deemed as being encompassed by the present disclosure.

Various electronic devices or smart devices may have transducers, speakers any acoustic output transducers, for example any transducer for converting a suitable electrical driving signal into an acoustic output such as a sonic pressure wave or mechanical vibration. For example, many electronic devices may include one or more speakers or loudspeakers for sound generation, for example, for playback of audio content, voice communications and/or for providing audible notifications.

Such speakers or loudspeakers may comprise an electromagnetic actuator, for example a voice coil motor, which is mechanically coupled to a flexible diaphragm, for example a conventional loudspeaker cone, or which is mechanically coupled to a surface of a device, for example the glass screen of a mobile device. Some electronic devices may also include acoustic output transducers capable of generating ultrasonic waves, for example for use proximity detection type applications and/or machine-to-machine communication.

Many electronic devices may additionally or alternatively include more specialized acoustic output transducers, for example, haptic transducers, tailored for generating vibrations for haptic control feedback or notifications to a user. Additionally or alternatively an electronic device may have a connector, e.g. a socket, for making a removable mating connection with a corresponding connector of an accessory apparatus and may be arranged to provide a driving signal to the connector so as to drive a transducer, of one or more of the types mentioned above, of the accessory apparatus when connected. Such an electronic device will thus comprise driving circuitry for driving the transducer of the host device or connected accessory with a suitable driving signal. For acoustic transducers, the driving signal will generally be an analog time varying voltage signal, for example, a time varying waveform.

Figure 1A:
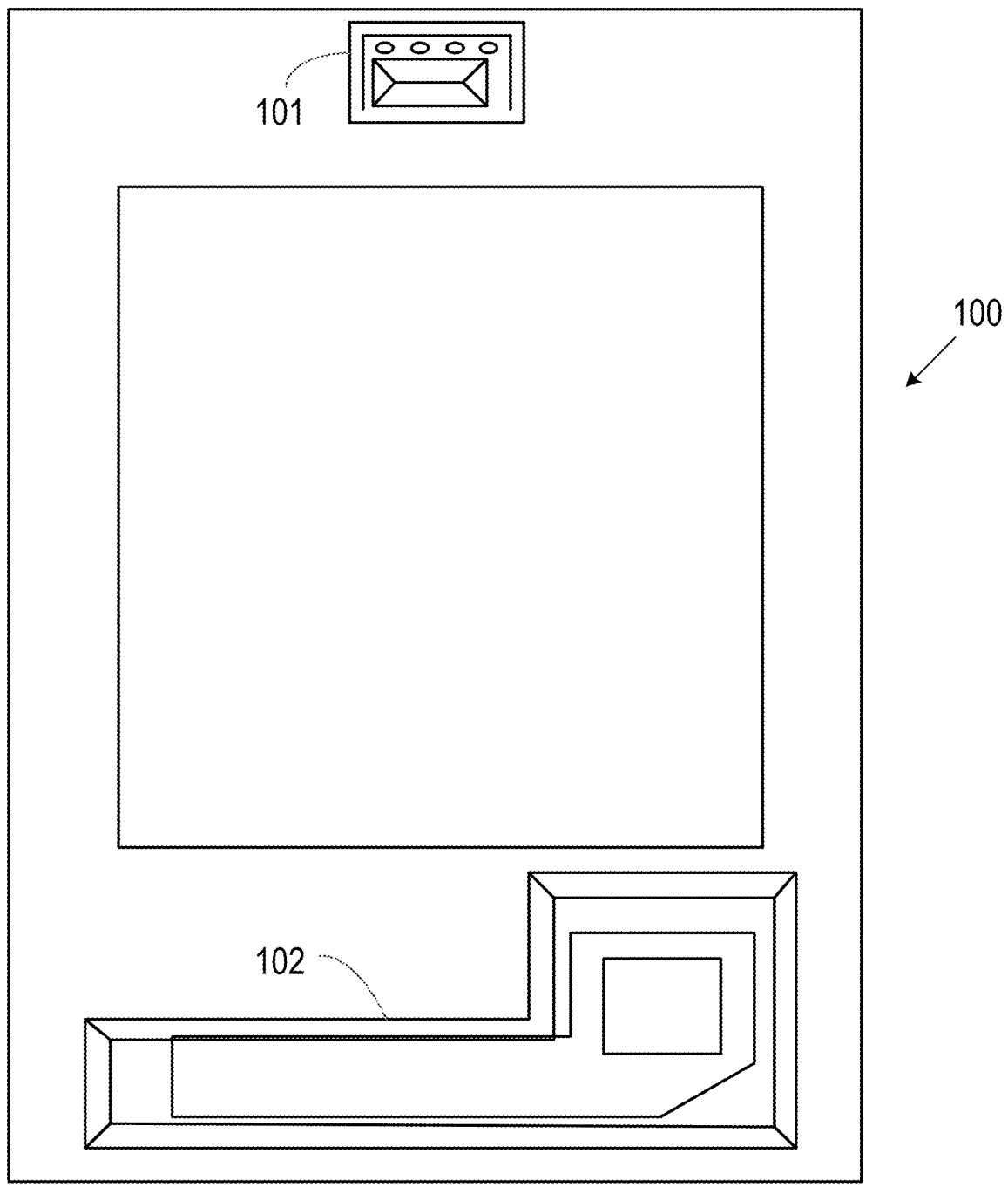
FIG. 1a illustrates an example of a mobile device 100 according to the prior art.
Figure 1B:
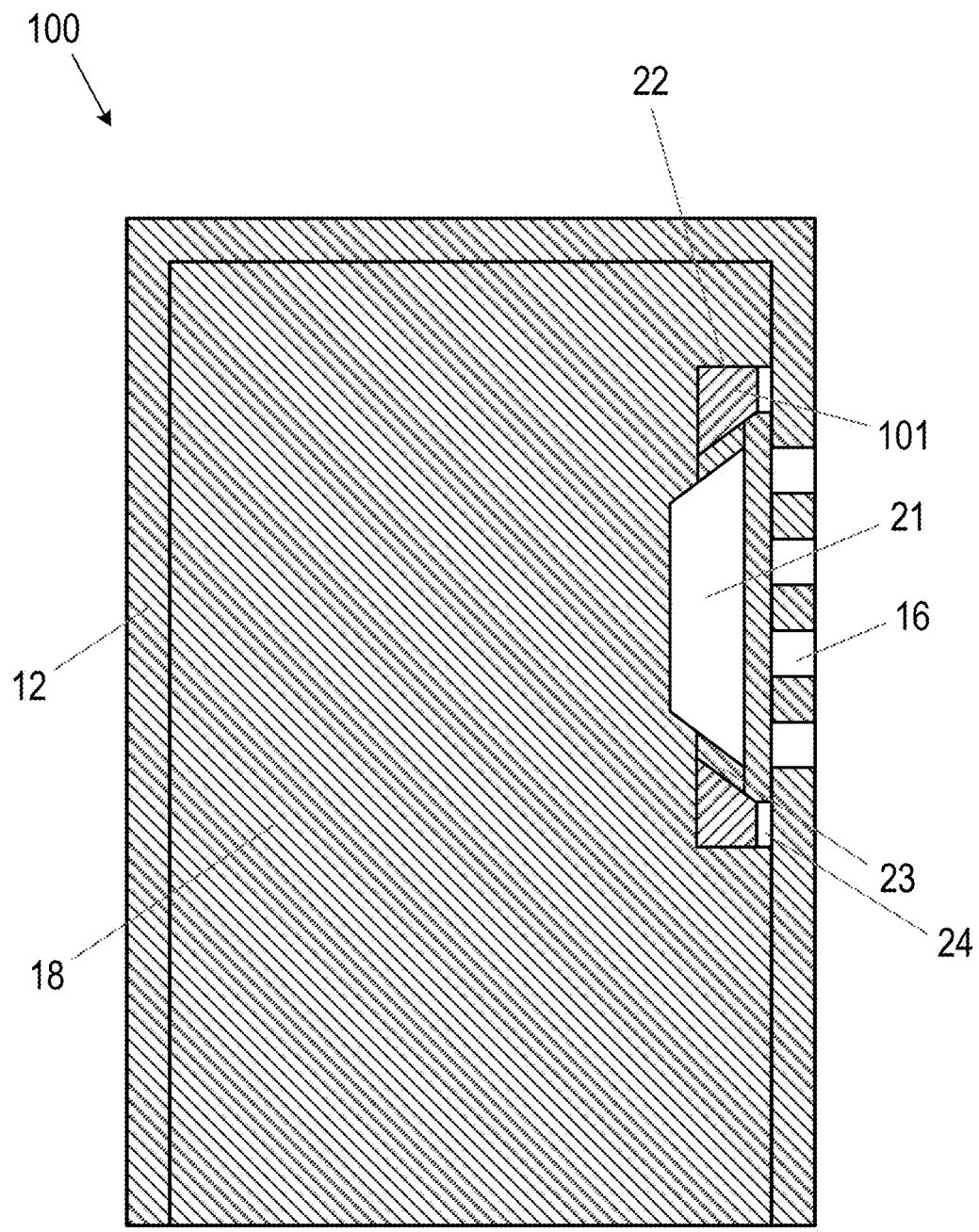
FIG. 1b illustrates the earpiece speaker 101 of the device 100 in more detail according to the prior art.
Figure 2:
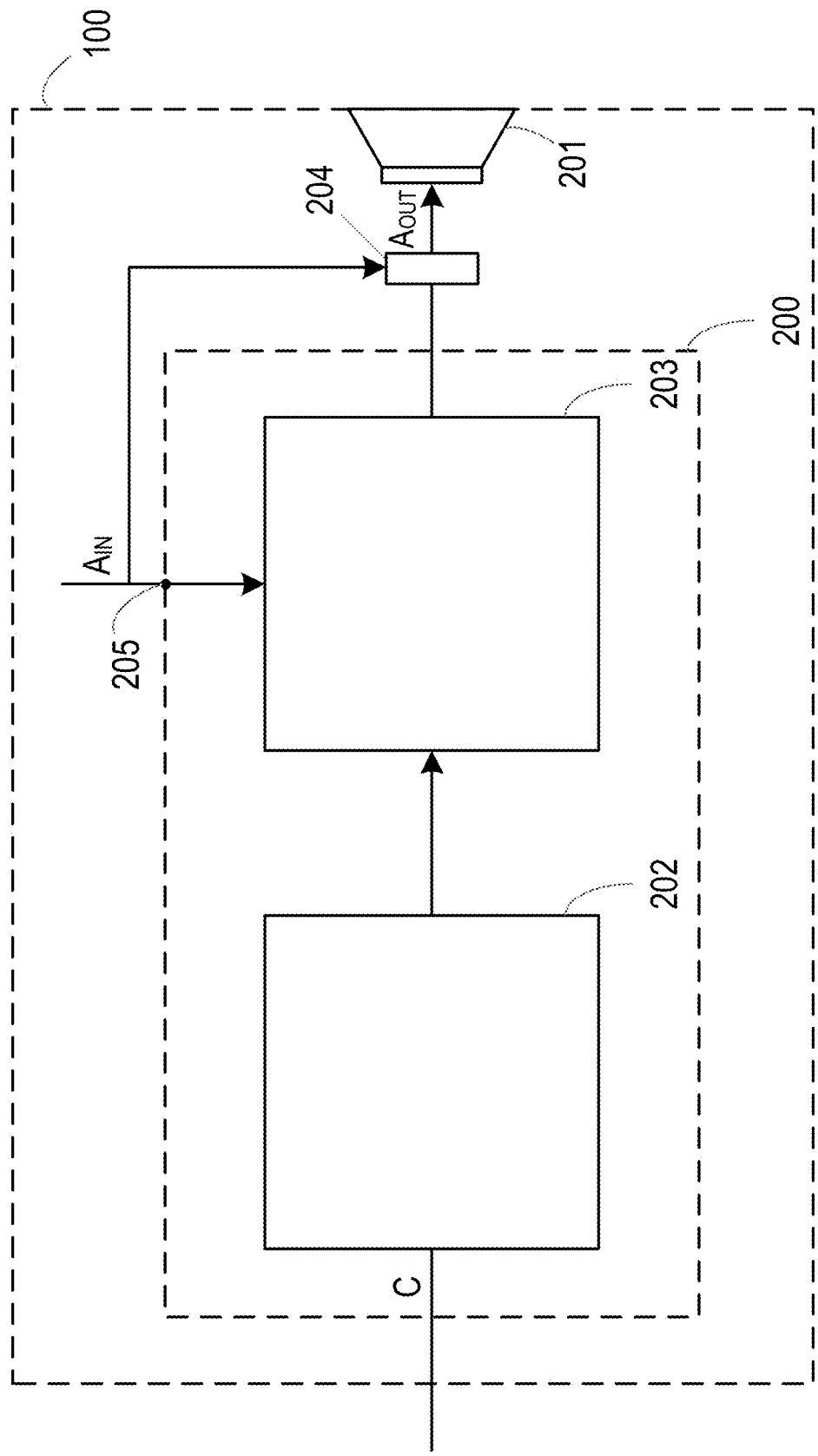
FIG. 2 illustrates an example of a compensation module 200 for compensating for a back electric motive force change in a transducer in a device in accordance with embodiments of the present disclosure.

FIG. 2 is an example of a compensation module 200 for compensating for a back electric motive force change in a transducer in a device 100 (similar to the device 100 illustrated in FIGS. 1a and 1b), wherein the transducer 201 is driven by an output signal $A_{OUT}$ output by an amplifier 204 and a back volume of the transducer is formed by an enclosure within the device, as illustrated in FIG. 1. It will be appreciated that the device 100 may comprise any one of: a portable device; a battery power device; a computing device; a communications device; a gaming device; a mobile telephone; a personal media player; a laptop, tablet or notebook computing device.

The compensation module 200 comprises a determination block 202 configured to determine, based on a characteristic of the transducer 201, that the transducer 201 has moved from an equilibrium position within the device. The compensation module 200 comprises an input 205 for receiving an input signal, wherein the input signal is connected to drive the transducer 201 through the amplifier 204. The compensation module 200 then further comprises a gain adjustment block 203 configured to, based on the determination, adjust a gain applied to the input signal $A_{IN}$ by the amplifier 204 to generate the output signal $A_{OUT}$.

The input signal $A_{IN}$ may be received from any circuitry or application generating or providing any signal suitable for output through the transducer 201. For example, the input signal $A_{IN}$ may be received from, for example, a memory card or internal memory within the device 100 that stores music files or audio files, such as ringtones or notification sounds. The input signal $A_{IN}$ may also be received from a wireless radio that receives audio data from remote sources, such as music services transmitting over a cellular or other wireless radio. The input signal $A_{IN}$ may be subject to one or more processing blocks within the device 100 before being passed to the compensation module 200.

It will be appreciated, that when the device 100 is under no external pressures, for example tapping or squeezing by a user of the device, the transducer may be positioned within the device 100 in an equilibrium position which is determined on manufacturing of the device 100. However, when external pressures are put on the device 100, which alter the air pressures in the back volume formed by the enclosure 18 within the device 100, this alteration may cause the transducer to move from its equilibrium position. For example, the transducer may move closer to the casing of the device 100, or to other components 17 within the device. If the transducer gets too close to either the casing of the device 100, or to another component within the device 100, then the membrane of the transducer may collide with the other component or casing of the device. This collision may result in audio distortion.

In some examples, the characteristic of the transducer 201 may comprise an excursion of a diaphragm of the transducer. In some examples, the characteristic of the transducer 201 may comprise an air pressure level in the back volume of the transducer. It will be appreciated, that other characteristics of the transducer may be used to determine that the transducer has moved from an equilibrium position within the device.

Figure 3:
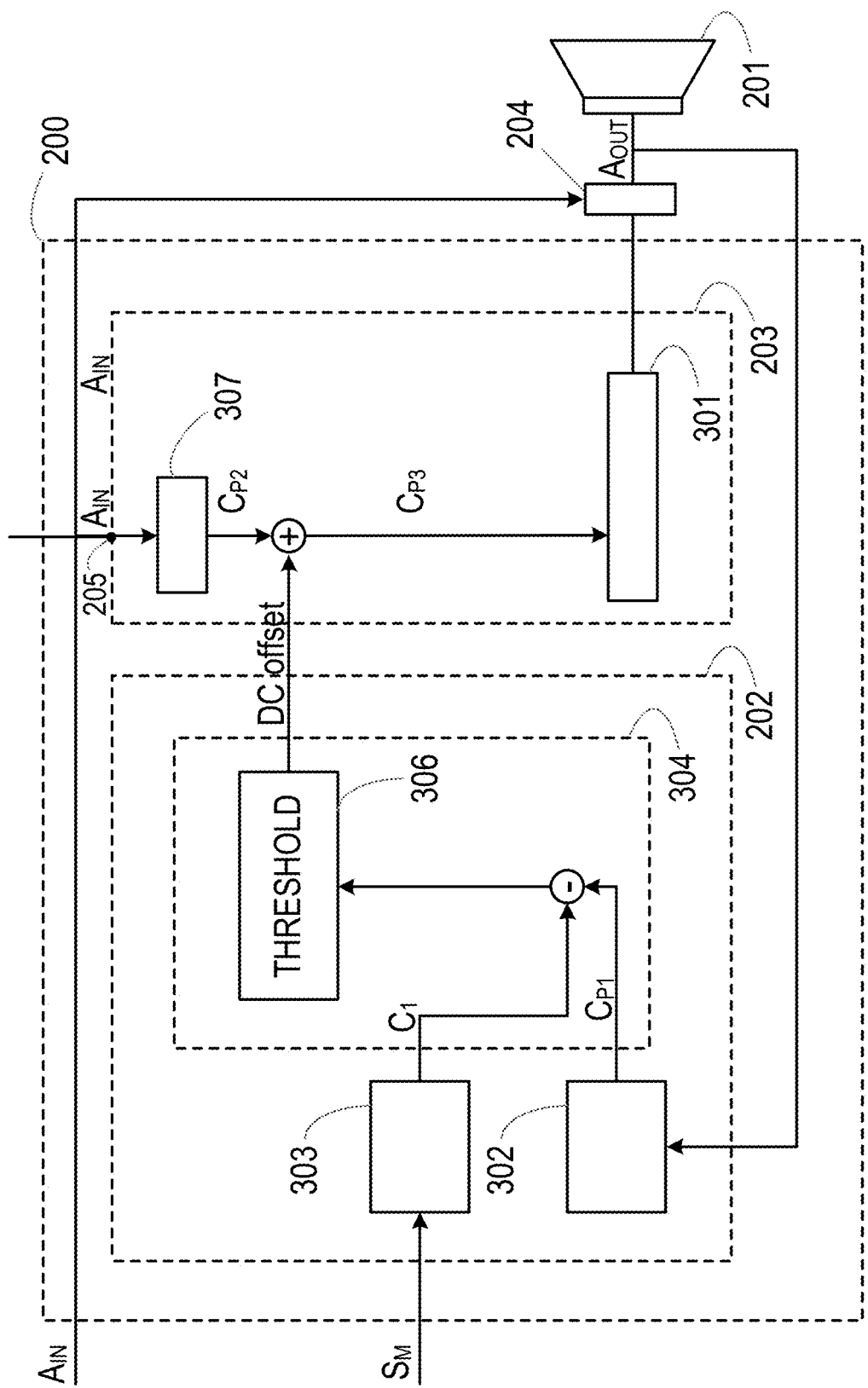
FIG. 3 illustrates an example implementation of the compensation module 200 illustrated in FIG. 2 in accordance with embodiments of the present disclosure.

FIG. 3 illustrates an example implementation of the compensation module illustrated in FIG. 2. In this example, the determination block 202 is configured to receive a monitored signal $S_M$. The determination block 202 may then determine based on the monitored signal a first value $C_1$ of the characteristic of the transducer. The determination block may also determine a first predicted value $C_{P1}$ of the characteristic of the transducer based on the output signal $A_{OUT}$. The determination block may then compare the first value $C_1$ to the predicted value $C_{P1}$; and based on the comparison, determine whether that the transducer has moved from the equilibrium position within the device.

For example, with the trend of pursuing for higher speaker output power on modern mobile devices, transducers/speakers are prone to be damaged from over-excursion. Transducer or speaker protection algorithms have been designed to protect the transducer or speaker from over-excursion. As a result, the audio content is adjusted to protect the speaker, for example using an excursion limiter 301.

In this example, the first predicted value $C_{P1}$ may comprise a modelled value of the excursion of the speaker. This first predicted value $C_{P1}$ may be calculated based on the output signal $A_{OUT}$ to be applied to the transducer 201. A high order model may provide more accuracy and may cover more features but may require computational effort. To balance the trade-offs between accuracy and computational effort, simpler schemes, like low-order fixed-model representations, may also be used. The prediction model block 302 may therefore receive the output signal $A_{OUT}$ and output a first predicted value of the excursion of the transducer 201. In some examples, the prediction model block 302 comprises a fixed model for the excursion of the transducer 201 which may be obtained through characterizing the transducer/speaker 201 over a wide range of frequency spectrum. The merit of representing the transducer/speaker using a fixed model is it reduces computational complexity and enables faster response for transducer/speaker protection. It will be appreciated that higher order models may also be used.

This first predicted value $C_{P1}$, however, is not able to reflect the real-time change of the back-EMF and the resulted audio distortion as it does not take into account pressure changing effects on the transducer. The difference between the model prediction and real-time feedback indicating any pressure changes may therefore be utilized as the indicator for the back-EMF change and any resulting possible audio distortion event.

The monitored signal may in these examples therefore comprise a signal received from a laser device positioned to measure the excursion of the diaphragm of the transducer 201. Alternatively, the monitored signal comprises a current signal across the transducer 201. The current signal across the transducer may then be used along with either an estimate of the voltage across the transducer, or a measured voltage across the transducer to estimate the excursion of the diaphragm. In this example, the estimation block 303 receives the monitored signal $S_M$ and derives the first value of the characteristic based on the monitored signal.

For example, where the monitored signal $S_M$ comprises an indication of the current and the voltage across the transducer 201, the estimation block 303 may implement a method here referred to as direct displacement to obtain the real-time diaphragm moving speed from the monitored current and voltage signals. The relation between speed $\dot{x}$, voltage Vin to the transducer/speaker 201, and current I across the transducer 201 is shown in equation 1.

$$Vin = Re \cdot I + Le \cdot dI/dt + Bl \cdot \dot{x} \quad (1)$$

where Re is the DC resistance, Le is the inductance, and Bl is the force factor of the transducer 201 respectively.

Equation 1 may be rearranged to compute the excursion of the speaker, x, as equation 2.

$$x = 1/Bl \int (Vin - Re \cdot I - Le \cdot dI/dt) dt \quad (2)$$

Therefore, while the change of back-EMF may not be predicted from the model computation, this information may be reflected from the electrical signals sent to the speaker or transducer. By analyzing the electrical signals, the real-time excursion of the speaker or transducer may be calculated and compared against the predicted excursion. The value of x may then be output as the first value $C_1$.

FIG. 4a illustrates a graph of the first predicted value $C_{P1}$ as a function of time for an output signal $A_{OUT}$ comprising a single frequency tone. FIG. 4b illustrates a graph of the first value $C_1$ as a function of time for an output signal $A_{OUT}$ comprising a single frequency tone. As can be seen, the maximum excursion of the first predicted value $C_{P1}$ remains constant as would be expected for a tone input signal. The maximum of the first value $C_1$, however, varies. In particular, in this example the device 100 is squeezed at the following times: 12 s, 30 s and 45 s, and released at the following times: 20 s, 38 s and 55 s. As can be seen, squeezing the device 100 reduces the excursion of the transducer 201 and releasing the device 100, while initially causing a slight reduction in excursion of the transducer 201, causes the excursion to increase. After both squeeze and release events, the excursion naturally corrects as the air pressure in the back volume corrects.

DC offset is a nonlinear phenomenon and would therefore require a nonlinear model to describe it fully. However the equations (1) and (2) used in this model are linear. Therefore, this direct displacement model may be utilized to detect when a change in the DC offset occurs without having to provide an accurate indication of the magnitude of the DC offset.

Returning to FIG. 3, the first value $C_1$ and first predicted value $C_{P1}$ may then be input into a comparison block 304 within the determination block 202. The comparison block 304 may be configured to determine a difference between the first value $C_1$ and the first predicted value $C_{P1}$. For example, the comparison block 304 may comprise a subtraction module 305 configured to receive the first value $C_1$ and the first predicted value $CP_1$ and to output a difference between the first value $C_1$ and the first predicted value $CP_1$. If there is a difference between the first value $C_1$ and the first predicted value $CP_1$, this difference may be indicative of a change in back-EMF as the excursion of the speaker is not matched to the prediction based on the output signal $A_{OUT}$. In other words, the excursion of the transducer is not therefore only being caused by the output signal $A_{OUT}$.

The difference between the first value $C_1$ and the first predicted value $CP_1$ may also be referred to as the DC offset, or offset value. The DC offset value may be representative of how much the transducer has moved from its equilibrium position within the device.

In some examples, the comparison block may comprise a threshold block 306 configured to compare the DC offset to a threshold value. Responsive to the DC offset being greater than the threshold value, the determination block may be configured to determine that the transducer has moved from the equilibrium position, and responsive to the difference being less than the threshold value, the determination block may be configured to determine that the transducer has not moved from the equilibrium position.

Responsive to this determination, the gain adjustment block 203 may adjust a gain applied to an input signal $A_{IN}$ by the amplifier 204 to generate the output signal $A_{OUT}$. The gain adjustment block 203 may be configured to decrease the gain applied to the input signal $A_{IN}$ by the amplifier 204 responsive to a determination that the transducer has moved from the equilibrium position. For example, the gain adjustment block 203 may in some examples be configured to receive the DC offset value and may adjust the gain directly based on the value of the DC offset. For example, if the value of the DC offset is larger, then the gain adjustment block 203 may cause the amplifier 204 to apply more attenuation to the input signal $A_{IN}$ to generate the output signal $A_{OUT}$.

However, in the embodiment illustrated in FIG. 3 responsive to the DC offset value being greater than the threshold value, the DC offset value is output to the gain adjustment block 203. Responsive to the DC offset value being less than the threshold value, the determination block 202 outputs a zero value for the offset to the gain adjustment block 203.

The gain adjustment block 203 may then be configured to determine a second predicted value $CP_2$ of the characteristic based on the input signal $A_{IN}$. This second predicted value $CP_2$ predicts the excursion of the transducer 201 due to the input signal $A_{IN}$ which is about to be input into the transducer 201. The second predicted value $CP_2$ may be calculated by second prediction model block 307 in a similar manner to the first predicted value $CP_1$, but may be based on the input signal $A_{IN}$ rather than the output signal $A_{OUT}$. The use of the threshold value prevents any unnecessary attenuation of input signals for small excursions which may, for example, be likely to recover before the algorithm can correct for them.

The threshold may be used to prevent attenuation when the size of the DC offset is small and may have been caused by other factors which are unrelated to the squeeze (e.g. noise in the sensor measurement).

The gain adjustment block 203 may also be configured to determine a third predicted value $C_{P3}$ of the characteristic by adding the received DC offset value to the second predicted value $CP_2$. As previously described, the DC offset value may be received from the comparison block 304. Alternatively, the DC offset may be derived from a characterization of the transducer mounted on the device. A typical value for the magnitude of the DC offset resulting from a squeeze or release event may be determined and may be used as a worst-case DC offset whenever the threshold is reached. The value of predicted value $CP_3$ may then represent the total predicted excursion of the transducer 201 due to both the input signal $A_{IN}$ about to be input to the transducer 201, and any excursion caused by a change in back EMF, which is represented by the DC offset value.

This third predicted value of the excursion of the transducer may then be input into an excursion limiting block 303. The excursion limiting block 303 may limit the total excursion of the transducer by reducing the gain applied to the input signal $A_{IN}$ by the amplifier 204 at times when the third predicted value $CP_3$ indicates that the excursion of the transducer would be too high. By including the DC offset value in the third predicted value $CP_3$, the excursion limiting block 303 may cause the amplifier 204 to increase the attenuation applied to the input signal $A_{IN}$ when there is further excursion of the transducer 201 due to a change in back EMF.

This increased attenuation therefore avoids excess excursion of the transducer 201 and hence avoids collisions between the transducer and either the casing of the device 100 or other components within the device 100.

Since the audio distortion related to excursion occurs rapidly and the cancellation as a reactive response has very short time tolerance, the appropriate audio output gain may be determined by trials in a real-time tuning environment. The performance of the cancellation of the audio distortion may also be related to the design of the excursion protection algorithm. For example, both the threshold determining when excursion protection is enabled, and the gain attenuation mechanism, may affect the cancellation performance. Therefore, the excursion protection mechanism may be taken into consideration as well for the tuning process of the audio distortion cancellation.

It will also be appreciated that in some examples, the characteristic of the transducer comprises the air pressure in the back volume. In these examples, the monitored signal $S_M$ may comprise a real-time measurement of the air pressure in the back volume which may, for example, be received from a pressure sensor located to measure the pressure in the back volume.

In these examples, the first value of the characteristic $C_1$ may comprise the real-time measurement of the air pressure, and the first predicted value $CP_1$ of the characteristic may comprise a modelled estimate of the air pressure in the back volume based on the output audio signal $A_{OUT}$. In these examples, the pressure difference between the first value and the first predicted value may be utilized to estimate the DC offset excursion caused by the change in back-EMF, for example using a fixed model generated by trials during tuning of the transducer 201. However, in some examples, the pressure difference may be output to the gain adjustment block 203, which may adjust the gain applied to the input signal by the amplifier 204 based on a predetermined model relating to the back-EMF pressure and excursion.

Due to the delay in the electric circuitry connected to the transducer 201, the first value $C_1$ may not be time-aligned with the first predicted value $CP_1$. At the same time, the excursion or back-EMF change may change instantly with a relatively high change ratio, and therefore the instant difference between the first predicted value $CP_1$ and first value $C_1$ may have large high frequency spikes. Therefore, the difference between the first value $C_1$ and the first predicted value $CP_1$ may be low-pass filtered over a period of time for detection, in order to avoid false positive or false negative detections of changes in back-EMF. The design of this low-pass filter may rely on the requirement of the computational complexity, time response, as well as the frequency band of interest. In some embodiments, if the low-pass filtered difference between the first value $C_1$ and the first predicted value $CP_1$ exceeds the threshold for comparison over a certain period of time, then a flag may be set indicating a change in back-EMF.

More parameters may be added to increase the robustness of the detection algorithm for detecting when a change in back EMF has occurred. For example, accumulating a number of the detection flags over a period of time to compare against a certain threshold before determining whether a change in back-EMF has occurred, may decrease the high frequency noise that may protect the audio performance from suffering sudden gain changes from the excursion protection. However, there are trade-offs between flag counters and responding time. Usually, a higher threshold of flag counters reduces false detection of the distortion events and enables higher robustness, while decreasing the responding speed, as it needs a longer time to process the electric signals.

Figure 5:
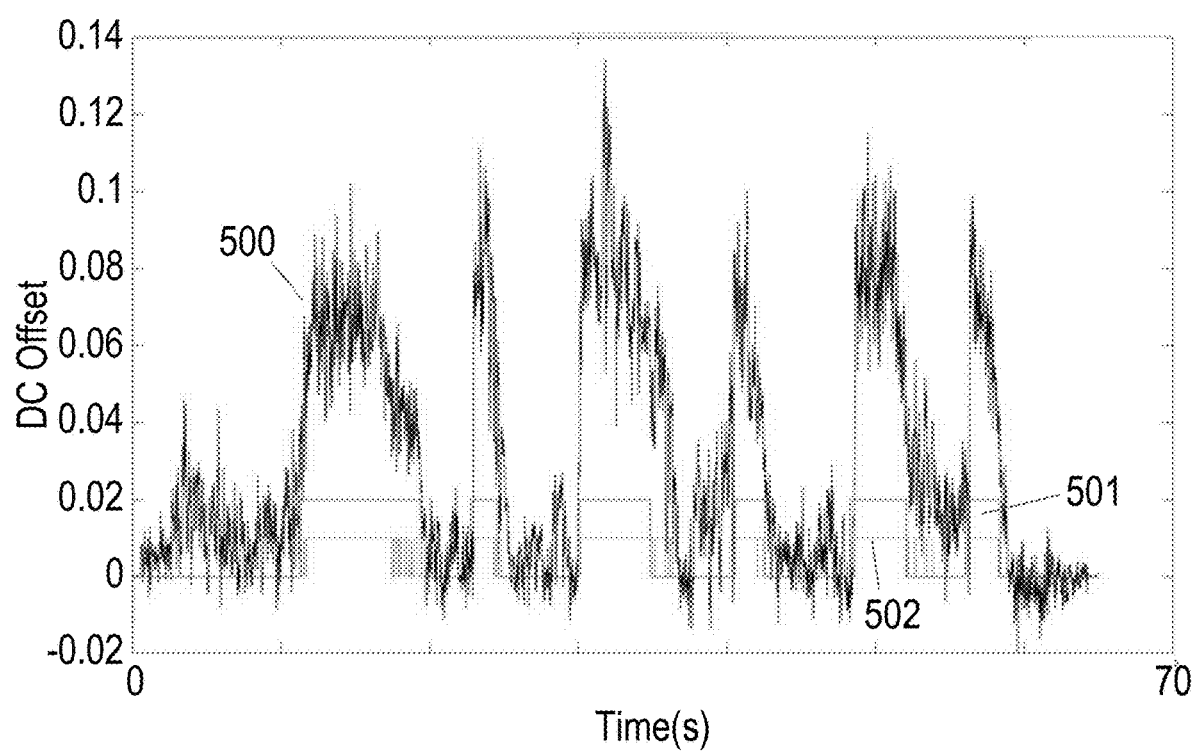
FIG. 5 is a graph of the difference between the first value $C_1$ and the first predicted value $C_{P1}$ as a function of time.

FIG. 5 is a graph of the difference between the first value $C_1$ and the first predicted value $CP_1$ as a function of time, indicated by the line 500. The times when distortion occur are also indicated by the line 501. The line 502 indicates when the difference between the first value $C_1$ and the first predicted value $CP_1$ is above a predetermined threshold value, for example 0.045 mm.

Figure 6:
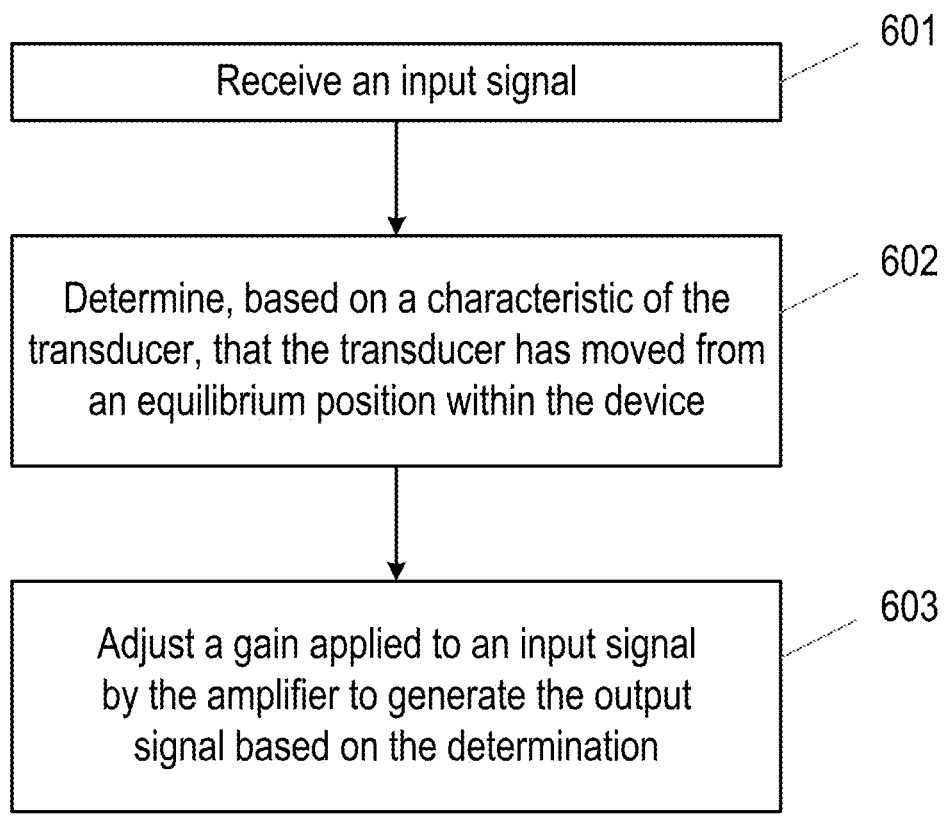
FIG. 6 is a flowchart illustrating an example method for compensating for a change in back electric motive force in a transducer in a device, wherein the transducer is driven by an output signal and a back volume of the transducer is formed by an enclosure within the device in accordance with embodiments of the present disclosure.

FIG. 6 is a flow chart illustrating a method for compensating for a change in back electric motive force in a transducer in a device, wherein the transducer is driven by an output signal, and a back volume of the transducer is formed by an enclosure within the device. The method may be performed by a compensation module 200 as described above.

In step 601 the method comprises receiving an input signal, wherein the input signal is connected to drive the transducer through the amplifier.

In step 602, the method comprises determining, based on a characteristic of the transducer, that the transducer has moved from an equilibrium position within the device.

In step 603, based on the determination, the method comprises adjusting a gain applied to the input signal by the amplifier to generate the output signal.

In summary, there is provided a method and apparatus to compensate for the audio distortion due to a change in back-EMF in a transducer. The method calculates a first predicted value for a characteristic of a transducer for a given audio output, obtains a first value of the real-time characteristic of the transducer, and evaluates a difference as an indication that a change in back-EMF has occurred. The characteristic of the transducer may comprise the excursion of the transducer, the air pressure in the back volume, or any other signal related to the back-EMF which is reflective of the back-EMF change. If a back-EMF change happens, the output gain applied to the audio signal may be attenuated accordingly to avoid the possible audio distortion.

This method is robust, tuneable, and fast acting. The embodiments described herein may also make use of existing excursion protection mechanisms so that no extra algorithm development and computation is required.

Further embodiments are described in the paragraphs below.

Paragraphs

1. A method of handling a transducer back electric motive force change within a smart device wherein the transducer is driven by an amplifier and uses an internal open space of the smart device as a back volume, comprising:
    using a monitored signal from the amplifier to estimate a first signature value of the transducer;
    using a transducer model for the signature value and a transducer input for the transducer to estimate a second signature value for the transducer; and
    comparing the first signature value and the second value to determine whether a change in the transducer back volume has occurred.

2. The method of paragraph 1, comprising: in response to determining the change in the transducer back electric motive force, directly adjusting the output audio gain.

3. The method of paragraph 1, comprising: in response to determining the change in the transducer back electric motive force, adjusting the offset between predicted signature value and real-time signature value feedback.

4. The method of paragraph 1, wherein the first signature value is a real-time estimated excursion or air pressure and the second excursion is a predicted excursion or air pressure.

5. The method of paragraph 1 wherein the monitored signal is a voltage monitor signal and a current monitor signal.

6. The method of paragraph 1 wherein the monitored signal is a measured excursion signal from laser devices.

7. The method of paragraph 1 wherein the monitored signal is a measured air pressure from pressure sensor devices.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in the claim, "a" or "an" does not exclude a plurality, and a single feature or other unit may fulfil the functions of several units recited in the claims. Any reference numerals or labels in the claims shall not be construed so as to limit their scope. Terms such as amplify or gain include possible applying a scaling factor or less than unity to a signal.

It will of course be appreciated that various embodiments of the analog conditioning circuit as described above or various blocks or parts thereof may be co-integrated with other blocks or parts thereof or with other functions of a host device on an integrated circuit such as a Smart Codec.

The skilled person will thus recognize that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure makes reference to specific embodiments, certain modifications and changes can be made to those embodiments without departing from the scope and coverage of this disclosure. Moreover, any benefits, advantages, or solution to problems that are described herein with regard to specific embodiments are not intended to be construed as a critical, required, or essential feature of element.

Further embodiments likewise, with the benefit of this disclosure, will be apparent to those having ordinary skill in the art, and such embodiments should be deemed as being encompasses herein.

The invention claimed is:

1. A method for compensating for a change in back electric motive force in a transducer in a device, wherein the transducer is driven by an output signal output by an amplifier, and a back volume of the transducer is formed by an enclosure within the device, the method comprising:
   receiving an input signal, wherein the input signal is connected to drive the transducer through the amplifier;
   receiving a monitored signal, and determining based on the monitored signal, a first value of the characteristic of the transducer;
   determining a predicted value of the characteristic of the transducer based on the output signal;
   comparing the first value to the predicted value;
   based on the comparison, determining whether the transducer has moved from an equilibrium position within the device; and
   based on the determination, adjusting a gain applied to the input signal by the amplifier to generate the output signal.

2. The method of claim 1 wherein the characteristic comprises an excursion of a diaphragm of the transducer.

3. The method of claim 2 wherein the monitored signal comprises a signal received from a laser device positioned to measure the excursion of the diaphragm of the transducer.

4. The method of claim 2 wherein the monitored signal comprises a current signal across the transducer.

5. The method of claim 4 wherein the monitored signal comprises a voltage signal across the transducer.

6. The method of claim 5 wherein the method further comprises calculating the first value based on the current signal and the voltage signal.

7. The method of claim 1 wherein the characteristic comprises an air pressure level in the back volume.

8. The method of claim 7 wherein the monitored signal comprises a real-time measurement of the air pressure in the back volume.

9. The method of claim 8 wherein the monitored signal is received from a pressure sensor.

10. The method of claim 1 wherein the step of comparing comprises:
    determining a difference between the first value and the first predicted value,
    comparing the difference to a threshold value,
    responsive to the difference being greater than the threshold value, determining that the transducer has moved from the equilibrium position, and
    responsive to the difference being less than the threshold value, determining that the transducer has not moved from the equilibrium position.

11. The method of claim 1 wherein the step of adjusting a gain comprises:
    determining a second predicted value of the characteristic based on the input signal,
    determining a third predicted value of the characteristic by adding an offset based on the comparison to the second predicted value; and
    adjusting the gain applied to the input signal by the amplifier based on the third predicted value.

12. The method of claim 1 wherein the step of adjusting the gain comprises:
    decreasing the gain applied to the input signal by the amplifier responsive to a determination that the transducer has moved from the equilibrium position.

13. A compensation module for compensating for a back electric motive force change in a transducer in a device, wherein the transducer is driven by an output signal output by an amplifier and a back volume of the transducer is formed by an enclosure within the device, the compensation module comprising:
    an input for receiving an input signal, wherein the input signal is connected to drive the transducer through the amplifier;
    a determination block configured to:
       receive a monitored signal;
       determine based on the monitored signal a first value of the characteristic of the transducer;
       determine a predicted value of the characteristic of the transducer based on the output signal;
       compare the first value to the predicted value; and
       based on the comparison, determine whether that the transducer has moved from an equilibrium position within the device; and
    a gain adjustment block configured to, based on the determination, adjust a gain applied to the input signal by the amplifier to generate the output signal.

14. The compensation module of claim 13 wherein the characteristic comprises an excursion of a diaphragm of the transducer.

15. The compensation module of claim 13 wherein the monitored signal comprises a signal received from a laser device positioned to measure the excursion of the diaphragm of the transducer.

16. The compensation module of claim 13 wherein the monitored signal comprises a current signal across the transducer.

17. The compensation module of claim 16 wherein the monitored signal comprises a voltage signal across the transducer.

18. The compensation module of claim 17 wherein the determination module is further configured to calculate the first value based on the current signal and voltage signals across the transducer.

19. The compensation module of claim 13 wherein the characteristic comprises an air pressure level in the back volume.

20. The compensation module of claim 19 wherein the monitored signal comprises a real time measurement of the air pressure in the back volume.

21. The compensation module of claim 20 wherein the monitored signal is received from a pressure sensor.

22. The compensation module of claim 13 wherein determination block comprises a comparison block configured to:
determine a difference between the first value and the predicted value, and
compare the difference to a threshold value, wherein
responsive to the difference being greater than the threshold value, the determination block is configured to determine that the transducer has moved from the equilibrium position, and
responsive to the difference being less than the threshold value, the determination block is configured to determine that the transducer has not moved from the equilibrium position.

23. The compensation module of claim 13 wherein the gain adjustment block is configured to:
determine a second predicted value of the characteristic based on the input signal,
determine a third predicted value of the characteristic by adding an offset based on the comparison to the second predicted value; and
adjust the gain applied to the input signal by the amplifier based on the third predicted value.

24. The compensation module of claim 13 wherein the gain adjustment block is configured to:
decrease the gain applied to the input signal by the amplifier responsive to a determination that the transducer has moved from the equilibrium position.

25. An integrated circuit comprising:
a compensation module for compensating for a back electric motive force change in a transducer in a device, wherein the transducer is driven by an output signal output by an amplifier, and a back volume of the transducer is formed by an enclosure within the device, the compensation module comprising:
an input for receiving an input signal, wherein the input signal is connected to drive the transducer through the amplifier;
a determination block configured to:
receive a monitored signal;
determine based on the monitored signal a first value of the characteristic of the transducer;
determine a predicted value of the characteristic of the transducer based on the output signal;
compare the first value to the predicted value; and
based on the comparison, determine whether that the transducer has moved from an equilibrium position within the device; and
a gain adjustment block configured to, based on the determination, adjust a gain applied to the input signal by the amplifier to generate the output signal.

26. An electronic apparatus comprising an integrated circuit wherein the integrated circuit comprises:
a compensation module for compensating for a back electric motive force change in a transducer in a device, wherein the transducer is driven by an output signal output by an amplifier, and a back volume of the transducer is formed by an enclosure within the device, the compensation module comprising:
an input for receiving an input signal, wherein the input signal is connected to drive the transducer through the amplifier;
a determination block configured:
receive a monitored signal;
determine based on the monitored signal a first value of the characteristic of the transducer;
determine a predicted value of the characteristic of the transducer based on the output signal;
compare the first value to the predicted value; and
based on the comparison, determine whether that the transducer has moved from an equilibrium position within the device; and
a gain adjustment block configured to, based on the determination, adjust a gain applied to the input signal by the amplifier to generate the output signal.

27. The electronic apparatus of claim 26 wherein said apparatus is at least one of: a portable device; a battery power device; a computing device; a communications device; a gaming device; a mobile telephone; a personal media player; a laptop, tablet or notebook computing device.

* * * * *

UNITED STATES PATENT AND TRADEMARK OFFICE
CERTIFICATE OF CORRECTION

PATENT NO.        : 10,778,173 B2
APPLICATION NO.   : 16/169723
DATED             : September 15, 2020
INVENTOR(S)       : Zhu et al.

It is certified that error appears in the above-identified patent and that said Letters Patent is hereby corrected as shown below:

In the Specification

1. In Column 7, Line 23, delete "$CP_1$" and insert -- $C_{P1}$ --, therefor.

2. In Column 7, Line 24, delete "$CP_1$" and insert -- $C_{P1}$ --, therefor.

3. In Column 7, Line 26, delete "$CP_1$" and insert -- $C_{P1}$ --, therefor.

4. In Column 7, Line 32, delete "$CP_1$" and insert -- $C_{P1}$ --, therefor.

5. In Column 7, Line 65, delete "$CP_2$" and insert -- $C_{P2}$ --, therefor.

6. In Column 7, Line 67, delete "$CP_2$" and insert -- $C_{P2}$ --, therefor.

7. In Column 8, Line 2, delete "$CP_2$" and insert -- $C_{P2}$ --, therefor.

8. In Column 8, Line 4, delete "$CP_1$" and insert -- $C_{P1}$ --, therefor.

9. In Column 8, Line 17, delete "$CP_2$" and insert -- $C_{P2}$ --, therefor.

10. In Column 8, Line 24, delete "$CP_3$" and insert -- $C_{P3}$ --, therefor.

11. In Column 8, Line 34, delete "$CP_3$" and insert -- $C_{P3}$ --, therefor.

12. In Column 8, Line 36, delete "$CP_3$" and insert -- $C_{P3}$ --, therefor.

13. In Column 8, Line 66, delete "$CP_1$" and insert -- $C_{P1}$ --, therefor.

14. In Column 9, Line 13, delete "$CP_1$" and insert -- $C_{P1}$ --, therefor.

Signed and Sealed this
Eighth Day of November, 2022

Katherine Kelly Vidal
*Director of the United States Patent and Trademark Office*

CERTIFICATE OF CORRECTION (continued)
U.S. Pat. No. 10,778,173 B2

15. In Column 9, Line 16, delete "$CP_1$" and insert -- $C_{P1}$ --, therefor.

16. In Column 9, Line 19, delete "$CP_1$" and insert -- $C_{P1}$ --, therefor.

17. In Column 9, Line 26, delete "$CP_1$" and insert -- $C_{P1}$ --, therefor.

18. In Column 9, Line 44, delete "$CP_1$" and insert -- $C_{P1}$ --, therefor.

19. In Column 9, Line 48, delete "$CP_1$" and insert -- $C_{P1}$ --, therefor.

In the Claims

20. In Column 12, Line 33, in Claim 11, delete "a gain" and insert -- the gain --, therefor.

21. In Column 14, Line 34, in Claim 26, delete "configured:" and insert -- configured to: --, therefor.